(12) United States Patent
Prasad et al.

(10) Patent No.: US 10,522,695 B2
(45) Date of Patent: Dec. 31, 2019

(54) INORGANIC MULTILAYER STACK AND METHODS AND COMPOSITIONS RELATING THERETO

(75) Inventors: Ravi Prasad, Corvallis, OR (US); Dennis R. Hollars, San Jose, CA (US)

(73) Assignee: VITRIFLEX, INC., San Jose, CA (US)

( * ) Notice: Subject to any disclaimer, the term of this patent is extended or adjusted under 35 U.S.C. 154(b) by 841 days.

(21) Appl. No.: 13/981,317

(22) PCT Filed: Jan. 27, 2012

(86) PCT No.: PCT/US2012/022809
§ 371 (c)(1),
(2), (4) Date: Nov. 13, 2013

(87) PCT Pub. No.: WO2012/103390
PCT Pub. Date: Aug. 2, 2012

(65) Prior Publication Data
US 2014/0060648 A1    Mar. 6, 2014

Related U.S. Application Data

(60) Provisional application No. 61/436,726, filed on Jan. 27, 2011, provisional application No. 61/436,732, (Continued)

(51) Int. Cl.
*H01L 31/0203*    (2014.01)
*C23C 14/08*    (2006.01)
(Continued)

(52) U.S. Cl.
CPC .......... *H01L 31/0203* (2013.01); *C23C 14/08* (2013.01); *C23C 14/562* (2013.01); (Continued)

(58) Field of Classification Search
CPC ...................... H01L 31/0208; H01L 31/0203; G02F 1/0107
See application file for complete search history.

(56) References Cited

U.S. PATENT DOCUMENTS 5,318,685 A * 6/1994 O'Shaughnessy ...... C03C 17/36
204/192.15
6,960,877 B1    11/2005 Heeks
(Continued)

FOREIGN PATENT DOCUMENTS

AU    784621 B2    5/2006
CN    1376111 A    10/2002
(Continued)

OTHER PUBLICATIONS

PCT Application No. PCT/US2012/022809, filed Jan. 27, 2012, Inventors Prasad et al., International Search Report and Written Opinion dated Sep. 3, 2012.
(Continued)

*Primary Examiner* — Eugene Lee
(74) *Attorney, Agent, or Firm* — EcoTech Law Group. P.C.

(57) ABSTRACT

A multilayer stack is described. The multilayer stack includes: (i) one or more inorganic barrier layers for reducing transport of gas or vapor molecules therethrough; (ii) an inorganic reactive layer disposed adjacent to one or more of the inorganic barrier layers, and the reactive layer capable of reacting with the gas or the vapor molecules; and (iii) wherein, in an operational state of the multilayer stack, the vapor or the gas molecules that diffuse through one or more of the inorganic barrier layers react with the inorganic reactive layer, and thereby allow said multilayer stack to be substantially impervious to the gas or the vapor molecules.

15 Claims, 4 Drawing Sheets

Related U.S. Application Data filed on Jan. 27, 2011, provisional application No. 61/436,744, filed on Jan. 27, 2011.

(51) Int. Cl.

| | | |
|---|---|---|
| *C23C 14/56* | (2006.01) | |
| *H01L 51/52* | (2006.01) | |
| *C23C 16/44* | (2006.01) | |
| *C25B 9/08* | (2006.01) | |
| *G02F 1/01* | (2006.01) | |
| *G02F 1/1339* | (2006.01) | |
| *G02F 1/167* | (2019.01) | |
| *H01L 21/56* | (2006.01) | |
| *H01L 23/00* | (2006.01) | |
| *H01L 31/0392* | (2006.01) | |
| *H01L 31/049* | (2014.01) | |

(52) U.S. Cl.
CPC .............. *C23C 16/44* (2013.01); *C25B 9/08* (2013.01); *G02F 1/0107* (2013.01); *G02F 1/1339* (2013.01); *G02F 1/167* (2013.01); *H01L 21/56* (2013.01); *H01L 23/564* (2013.01); *H01L 31/03926* (2013.01); *H01L 31/049* (2014.12); *H01L 51/5256* (2013.01); *H01L 51/5259* (2013.01); *H01L 2924/0002* (2013.01); *Y02E 10/541* (2013.01); *Y02E 10/542* (2013.01); *Y02E 10/549* (2013.01); *Y02P 20/134* (2015.11); *Y10T 428/265* (2015.01); *Y10T 428/31504* (2015.04); *Y10T 428/31678* (2015.04)

(56) References Cited

U.S. PATENT DOCUMENTS

| | | | | |
|---|---|---|---|---|
| 2003/0203210 A1* | 10/2003 | Graff | ................ | H01L 51/0097 428/412 |
| 2006/0063015 A1 | 3/2006 | McCormick | | |
| 2006/0093795 A1 | 5/2006 | Wang | | |
| 2007/0010101 A1 | 1/2007 | Mardilovich | | |
| 2007/0243328 A1* | 10/2007 | Liu | ...................... | C23C 14/083 427/255.33 |
| 2008/0020550 A1* | 1/2008 | Ye | ...................... | H01L 29/7869 438/478 |
| 2008/0078444 A1 | 4/2008 | Petar | | |
| 2009/0126573 A1 | 5/2009 | Kinoshita | | |
| 2009/0179210 A1* | 7/2009 | Cok | ................... | H01L 27/3211 257/98 |
| 2009/0242992 A1 | 10/2009 | Kim | | |
| 2009/0284141 A1* | 11/2009 | Sakanoue | ........... | H01L 51/5088 313/504 |
| 2010/0038669 A1* | 2/2010 | McKenzie | ............ | H01L 33/405 257/98 |
| 2010/0215929 A1 | 8/2010 | Seo | | |
| 2010/0264415 A1* | 10/2010 | Tatsumi | ............ | H01L 21/76864 257/52 |
| 2010/0300512 A1 | 12/2010 | Auvray | | |
| 2011/0003279 A1 | 1/2011 | Patel | | |
| 2011/0206777 A1* | 8/2011 | Vijayaraghavan | ..... | A01N 59/16 424/641 |
| 2012/0223291 A1* | 9/2012 | Klem | ..................... | B82Y 10/00 257/21 |
| 2013/0210176 A1* | 8/2013 | Fushimi | .............. | H01L 51/5256 438/26 |

FOREIGN PATENT DOCUMENTS

| | | |
|---|---|---|
| CN | 1150639 C | 5/2004 |
| CN | 101027798 A | 8/2007 |
| CN | 101330971 A | 12/2008 |
| JP | 2002-532847 A | 10/2002 |
| JP | 2008-513256 A | 5/2008 |
| JP | 2009-246362 A | 10/2009 |
| JP | 2010-511267 A | 4/2010 |
| KR | 20137022488 A | 1/2012 |
| WO | WO 00 36661 | 6/2000 |
| WO | WO 2006 036393 | 4/2006 |
| WO | WO 2008 057045 | 5/2008 |
| WO | WO 2009/053886 | 4/2009 |
| WO | WO 2009/086095 | 7/2009 |
| WO | 2012103390 A2 | 8/2012 |

OTHER PUBLICATIONS

PCT Application No. PCT/US2012/022809, filed Jan. 27, 2012, Inventors Prasad et al., International Preliminary Examination Report (IPER) dated Jul. 30, 2013.
Australian Application No. 2012211217, Int'l Filing Jan. 27, 2012, Inventors Prasad et al., Exam Report dated Apr. 28, 2015.
Japanese Application No. 2013-551351, Int'l Filing Jan. 27, 2012, Inventors Prasad et al., Japanese Office Action dated Jan. 8, 2016.
Russian Application No. 2013137882/20 (057210), Int'l Filing Jan. 27, 2012, Inventors Prasad et al., Russian Office Action dated Feb. 5, 2016.
EP Application No. 12739625.7, Int'l Filing Date: Jan. 27, 2012, Inventors Prasad et al., EP Extended Search Report dated Jun. 6, 2016.
Office Action for Japanese Application No. 2016-234148 dated Nov. 20, 2017, 9 pages.
Examination Report for Indian Application No. 6618/DELNP/2013 dated Feb. 2, 2018, 5 pages.
Vietnamese Office Action for VN Application No. 1-2013-02545 dated Dec. 20, 2018, 4 pages including 2 pages of English translation.
Office Action received for CN Patent Application No. 201710090395.2 dated Jun. 24, 2019, 16 pages including 3 pages of English translation.

* cited by examiner

*Figure 1*

(Prior Art)

INORGANIC MULTILAYER STACK AND METHODS AND COMPOSITIONS RELATING THERETO

RELATED APPLICATION

The application claims priority from U.S. Provisional Application having Ser. Nos. 61/436,726, 61/436,732 and 61/436,744, each of which was filed on Jan. 27, 2011, and each of which is incorporated herein by reference for all purposes.

FIELD OF THE INVENTION

The present invention relates generally to multilayer stacks and methods and compositions thereof. More particularly, the present invention relates to flexible multilayer stacks used as encapsulants in such applications as solar cells, electrolytic cells, solid state lighting and light-emitting diode ("LED") display fabrication.

BACKGROUND OF THE INVENTION

Many products, such as electronic devices, medical devices and pharmaceuticals, are sensitive to water vapor and ambient gases, and exposure to them causes product deterioration and/or product performance degradation. Consequently, blocking coatings are commonly used as a protective measure to safeguard against such undesired exposure.

Plastic coating or layers are frequently used as blocking coatings. Unfortunately, they suffer from poor gas and liquid permeation resistance, which have values that are typically several orders of magnitude below the requisite value of permeation resistance for acceptable product performance. By way of example, certain LED display and solar cell encapsulation applications require water vapor transmission on the order of $<10^{-4}$ grams/square meter/day, and in contrast, the water vapor transmission rate for Polyethylene Terephthalate (PET), a commonly used plastic substrate, is in the order of between about 1 and about 10 grams/square meter/day. Those skilled in the art will recognize that water vapor transmission can be thought of as being inversely proportional to water permeation resistance.

Other approaches protect against exposure to undesired elements by applying a blocking coating to plastic films like PET, to reduce water vapor permeability. These coatings are typically single layers of inorganic materials like Al, $SiO_x$, $AlO_x$ and $Si_3N_4$, deposited onto the plastic substrates using well-known vacuum deposition processes. A single layer coating of these inorganic materials typically will reduce the water vapor permeability of PET from 1.0 to 0.1 grams/square meter/day. Thus, single blocking coating on a plastic substrate also fails to meet a requisite value of permeation resistance.

Figure 1:
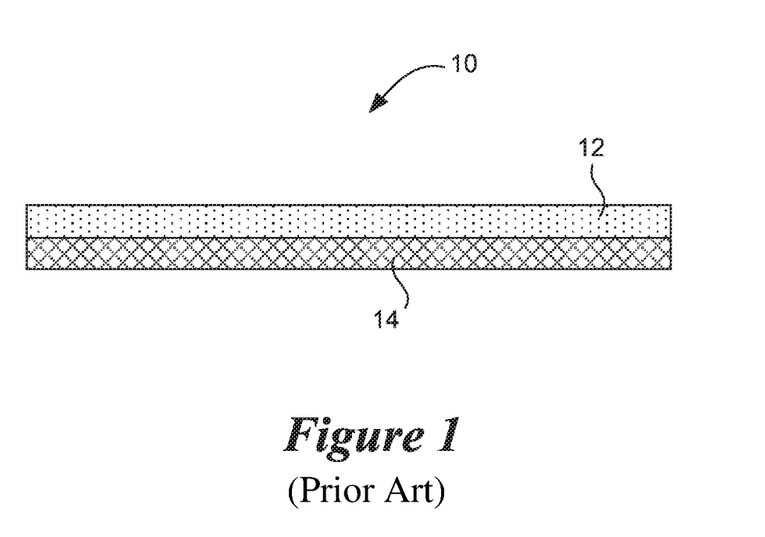
FIG. 1 shows a cross-sectional view of a conventional blocking coating used for encapsulating solar cells.

FIG. 1 shows a dyad 10, which refers to a structure that is formed when an inorganic blocking layer or coating 12 is formed atop an organic layer 14 (e.g., acrylic). Dyad 10 may be deposited as a protective layer on a polymeric substrate. Blocking layer 12 consists of densely packed oxide particles and acts as a conventional diffusive barrier, hindering gas and moisture permeation through it. Commonly found defects in a blocking layer, however, allow moisture and ambient gas molecules to diffuse through the oxide particles, and ultimately degrade the underlying electronic devices, such as solar cells and organic light emitting diodes. To overcome the drawbacks associated with the presence of these defects, organic layer 14 is applied to blocking layer 12 as an attempt to smooth defects and the underlying surface of polymeric substrate. Certain other approaches deposit multiple dyads on polymeric substrates serving the predicate that non-aligned defects present in multiple dyads further reduce gas and moisture permeation. However, depositing multiple dyads leads to more expensive barriers as well as reduces the flexibility of the final barrier film.

Regardless of whether a single layer of blocking coating or a single dyad or multiple dyads are used as a protective measure, conventional diffusion retarding schemes described above fail to protect an underlying polymeric layer to the requisite extent for a particular application (e.g., solar cell application and LED display application). Specifically, the defects present in the inorganic layer are not effectively filled-in and provide a diffusion pathway for moisture and undesired ambient gases to travel from the surface of the blocking layer to the polymer substrate. Conventional polymeric substrates are not able to adequately protect the underlying product that it encapsulates from exposure to moisture and undesired ambient gases. As a result, the underlying product degrades over time, eventually failing and suffering from a relatively shorter life span.

What is, therefore, needed are novel protective layer designs that effectively protect underlying moisture and gas sensitive products from moisture and undesired ambient gases, and that do not suffer from the drawbacks encountered by conventional designs of blocking layer and dyads.

SUMMARY OF THE INVENTION

In view of the foregoing, in one aspect, the present invention provides a multilayer stack. The multilayer stack includes: (i) one or more inorganic barrier layers for reducing transport of gas or vapor molecules therethrough; (ii) an inorganic reactive layer disposed adjacent to the one or more inorganic barrier layers, and the reactive layer capable of reacting with the gas or the vapor molecules; and (iii) wherein, in an operational state of the multilayer stack, the vapor or the gas molecules that diffuse through the one or more inorganic barrier layers react with the inorganic reactive layer, and thereby allow the multilayer stack to be substantially impervious to the gas or the vapor molecules.

The vapor or the gas molecules may include at least one member selected from a group consisting of moisture, oxygen, nitrogen, hydrogen, carbon dioxide, argon and hydrogen sulfide. In accordance with a preferred embodiment of the present invention, the inorganic barrier layer includes at least one member selected from a group consisting of a metal, a metal oxide, a metal nitride, a metal oxy-nitride, a metal carbo-nitride, and a metal oxy-carbide. The metal composition in the inorganic barrier layer preferably includes at least one member selected from a group consisting of aluminum, silver, silicon, zinc, tin, titanium, tantalum, niobium, ruthenium, gallium, platinum, vanadium, indium and carbon.

The inorganic reactive layer preferably includes at least one member selected from a group consisting of alkali metal oxide, zinc oxide, titanium oxide, metal-doped zinc oxide and silicon oxide. In certain embodiments, the inorganic layer of the present invention is doped with one or more non-oxide chemical components.

The thickness of each of the inorganic barrier layer and the inorganic reactive layer may be between about 10 nm and about 1 micron. In certain embodiments of the present invention, the one or more barrier layers include two barrier layers, and the reactive layer is sandwiched between the two barrier layers. The reactive layer preferably includes columnar structures. Each of the one or more barrier layers may be made from one or more amorphous materials. The inorganic barrier layers are preferably substantially transparent for applications requiring light transmission.

In another aspect, the present invention provides a solar module. The solar module includes: (i) a solar cell; and (ii) a solar cell encapsulant at least partially encapsulating the solar cell, and the solar cell encapsulant further includes: (a) one or more inorganic barrier layers for reducing transport of gas or vapor molecules therethrough; (b) an inorganic reactive layer disposed adjacent to the one or more inorganic barrier layers, and the reactive layer is capable of reacting with the gas or the vapor molecules; and (c) wherein, in an operational state of the solar cell encapsulant, the vapor or the gas molecules that diffuse through the one or more inorganic barrier layers react with the inorganic reactive layer, and thereby allow the solar cell encapsulant to protect the solar cell from the gas or the vapor molecules. In one embodiment, the solar cell of the present invention is one member selected from a group consisting of a silicon-based solar cell, a thin-film solar cell, a organic photo-voltaic solar cell and a dye-sensitized solar cell. The thin-film solar cell preferably includes at least one member selected from a group consisting of copper, indium, gallium, arsenic, cadmium, tellurium, selenium and sulfur.

In yet another aspect, the present invention provides a light generating module. The light generating module includes: (i) a light source; and (ii) a light source encapsulant at least partially encapsulating the light source, and the light source encapsulant further includes: (a) one or more inorganic barrier layers for reducing transport of gas or vapor molecules therethrough; (b) an inorganic reactive layer disposed adjacent to the one or more inorganic barrier layers, and the reactive layer capable of reacting with the gas or the vapor molecules; and (c) wherein, in an operational state of the light source encapsulant, the vapor or the gas molecules that diffuse through the one or more inorganic barrier layers react with the inorganic reactive layer, and thereby allow the light source encapsulant to protect the light source from the gas or the vapor molecules. In certain embodiments, the light source of the present invention includes organic or inorganic light emitting diodes.

In yet another aspect, the present invention includes a light emitting diode ("LED") display. The LED display includes: (i) an LED; and (ii) an LED encapsulant at least partially encapsulating the LED, and the LED encapsulant further includes: (a) one or more inorganic barrier layers for reducing transport of the gas or the vapor molecules therethrough; (b) an inorganic reactive layer disposed adjacent to the one or more inorganic barrier layers, and the reactive layer is reactive with the gas or the vapor molecules; and (c) wherein, in an operational state of the LED encapsulant, the vapor or the gas molecules that diffuse through the one or more inorganic barrier layers react with the inorganic reactive layer, and thereby allow the LED encapsulant to protect the LED from the gas or the vapor molecules. In certain embodiments, the LED of the present invention includes organic light emitting diodes, also known as OLED's.

In yet another aspect, the present invention provides an electrolytic cell. The electrolytic cell includes: (i) a cathode; (ii) an anode; (iii) an electrolyte; and (iv) an electrolytic cell encapsulant at least partially encapsulating the cathode, the anode and the electrolyte, the electrolytic cell encapsulant further includes: (a) one or more inorganic barrier layers for reducing transport of the gas or the vapor molecules therethrough; (b) an inorganic reactive layer disposed adjacent to the one or more inorganic barrier layers, and the reactive layer is reactive with the gas or the vapor molecules; and (c) wherein, in an operational state of the electrolytic cell encapsulant, the vapor or the gas molecules that diffuse through the one or more inorganic barrier layers react with the inorganic reactive layer, and thereby allow the electrolytic cell encapsulant to protect the electrolytic cell from the gas or the vapor molecules. In certain embodiments, the electrolytic cell of the present invention is flexible.

In another aspect, the present invention provides a reflective display module. The reflective display module includes: (i) a reflective display; and (ii) a reflective display encapsulant at least partially encapsulating the reflective display, and the reflective display encapsulant including: (a) one or more inorganic barrier layers for reducing transport of gas or vapor molecules therethrough; (b) an inorganic reactive layer disposed adjacent to the one or more inorganic barrier layers, and the reactive layer capable of reacting with the gas or the vapor molecules; and (c) wherein, in an operational state of the reflective display encapsulant, the vapor or the gas molecules that diffuse through the one or more inorganic barrier layers react with the inorganic reactive layer, and thereby allow the reflective display encapsulant to protect the reflective display from the gas or the vapor molecules. The reflective display includes an electrophoretic display or a multi-layer liquid crystal display.

In yet another aspect, the present invention provides a process of fabricating a multilayer stack. The process includes: (i) loading a flexible substrate on a coating machine; (ii) displacing the flexible substrate or a portion of the coating machine such that the flexible substrate acquires a first position inside the coating machine; (iii) fabricating one or more inorganic barrier layers on the flexible substrate when the flexible substrate is at the first position, and the inorganic barrier layer capable of reducing transport of vapor or gas molecules therethrough; (iv) displacing the flexible substrate or the coating machine such that the flexible substrate acquires a second position inside the coating machine, and the second position is different from the first position; and (v) forming a reactive layer adjacent to the one or more barrier layers, the reactive layer being reactive to the vapor or the gas molecules that diffuse through the inorganic barrier layer, and the one or more barrier layers and the reactive layer on the flexible substrate combine to form the multilayer stack.

The above-described process preferably includes applying the multilayer stack to at least one member selected from a group consisting of a solar cell, a light source and a light emitting diode display, and an electrolytic cell. The fabricating step may include at least one technique selected from a group consisting of sputtering, reactive sputtering, evaporation, reactive evaporation, chemical vapor deposition, solution coating process and plasma enhanced chemical vapor deposition. Similarly, forming the reactive layer preferably includes at least one technique selected from a group consisting of sputtering, reactive sputtering, evaporation, reactive evaporation, chemical vapor deposition, solution coating process and plasma enhanced chemical vapor deposition. The fabricating step may be carried out at a temperature that is between about −20° C. and about 200° C. and forming the reactive layer is preferably carried out at a temperature that is between about −20° C. and about 200° C. Each of the fabricating step and the forming step are carried out in a roll-to-roll operation.

The loading step in the above-described process preferably includes: (a) positioning inside the coating machine the flexible substrate wrapped around a spool; and (b) extending and securing the flexible substrate to a take-up spool such that at least a portion of the flexible substrate is exposed to allow for the fabricating step. During the fabricating and the forming steps in the above-described process, the substrate may contact a drum, which is set at a temperature that is between about −20° C. and about 200° C.

In yet another aspect, the present invention provides a composition of a multilayer barrier stack. The composition includes: (i) an inorganic barrier layer for reducing transport of gas or vapor molecules therethrough, and the inorganic barrier layer including at least one member selected from a group consisting of a metal, a metal oxide, a metal nitride, a metal oxy-nitride, a metal carbo-nitride, and a metal oxy-carbide-nitride; and (ii) an inorganic reactive layer including an effective amount of a reactive material to react with the gases or the vapor molecules that have diffused through the organic barrier layer, and the reactive material includes at least one material selected from a group consisting of alkali metal oxide, zinc oxide, titanium oxide, metal-doped zinc oxide and silicon oxide. At least one member in said inorganic barrier layer may have a concentration that is a value between about 1% (by weight) and about 100% (by weight) and, similarly, at least one reactive material may have a concentration that is a value between about 1% (by weight) and about 100% (by weight).

The construction and method of operation of the invention, however, together with additional objects and advantages thereof, will be best understood from the following descriptions of specific embodiments when read in connection with the accompanying figures.

DETAILED DESCRIPTION OF THE PREFERRED EMBODIMENTS

In the following description, numerous specific details are set forth in order to provide a thorough understanding of the present invention. It will be apparent, however, to one skilled in the art that the present invention may be practiced without limitation to some or all of these specific details. In other instances, well-known process steps have not been described in detail in order to not unnecessarily obscure the invention.

Figure 2:
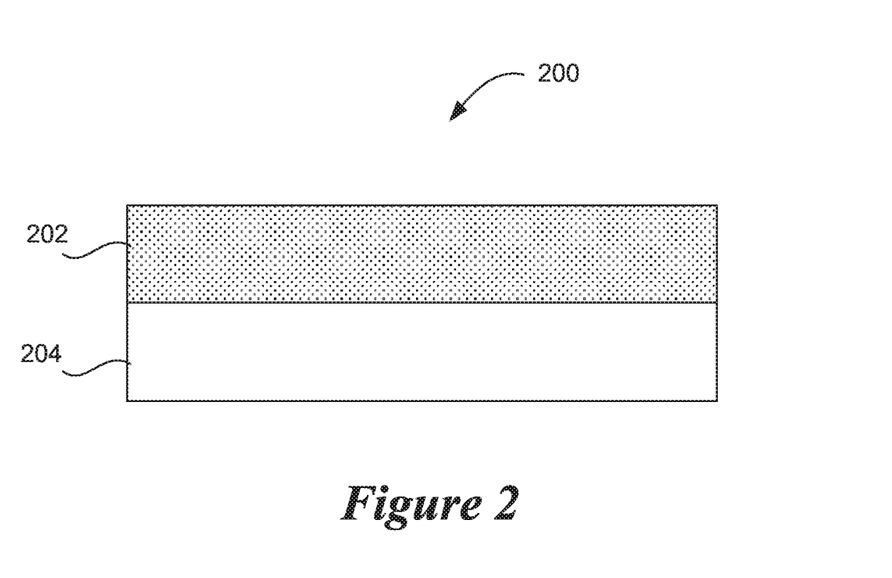
FIG. 2 shows a multilayer barrier stack, according to one embodiment of the present invention, for protecting against moisture and other undesirable ambient gases.

FIG. 2 shows a multilayer stack 200, in which a bather layer 202 is disposed adjacent to a reactive layer 204. Multilayer stack 200 is fabricated on a substrate, preferably a flexible one made from plastic. In accordance with a preferred embodiment, multilayer stack of the present invention serves as an encapsulant for a variety of applications. By way of example, a plastic substrate with multilayer stack 200 fabricated thereon is used for encapsulating solar cells, electrolytic cells, light generating modules, light emitting diode ("LED") displays and reflective displays to protect the underlying structure from exposure to moisture and undesirable or ambient gases.

In multilayer stack 200, barrier layer 202 serves as a barrier to moisture and undesired gases, such as oxygen, nitrogen, hydrogen, carbon dioxide, argon and hydrogen sulfide. Barrier layer 202 includes at least one material selected from a group consisting of a metal, metal oxide, a metal nitride, a metal oxy-nitride, a metal carbo-nitride and a metal oxy-carbide. Furthermore, barrier layer 202 preferably includes carbon or oxygen, in their elemental form or as part of chemical compounds. Examples of barrier layer 202 include silicon oxide, aluminum oxide, aluminum nitride, aluminum oxy-nitride, tantalum oxide, niobium oxide, silicon nitride, silicon oxy-nitride, silicon oxy-carbide and silicon carbo-nitride.

Barrier layer 202 may be made from one or more layers of an inorganic material. In preferred embodiments of the present invention, barrier layer 202 includes an amorphous material. When more than one inorganic layer is used, the different layers are preferably stacked adjacent each other. It is not necessary that the type of inorganic material used in each layer is the same, and may be different in certain embodiments of the present invention. Although barrier layer 202 may be made from any inorganic material that serves as a barrier to the above-mentioned ambient gases, in preferred embodiments of the present invention, barrier layer 202 includes a metal composition, present in its elemental form or as a compound (as described above), that includes at least one member selected from a group consisting of aluminum, silver, silicon, zinc, tin, titanium, tantalum, niobium, ruthenium, gallium, platinum, vanadium, and indium. By way of example, a metal oxide includes $Al_xO_y$ or $SiO_x$. In barrier layer 202, the presence of effective amount of metals or metal oxides reduces transport of undesired gas or vapor molecules through the barrier layer. In preferred embodiments of the present invention, in barrier layer 202, metals or metal oxides have a concentration that is between about 1% (by weight) and about 100% (by weight), and preferably between about 1% (by weight) and about 50% (by weight).

Barrier layer 202 has a thickness that is between about 10 nm and about 1 micron, and preferably between about 20 nm and about 300 nm.

Barrier layer 202 is designed to reduce transport of gas or vapor molecules therethrough, but is not completely impervious to moisture and certain molecules of undesired gases. To this end, the present invention employs a reactive layer 204, which is designed to react with moisture and molecules of undesired gases, e.g., oxygen, nitrogen, hydrogen, carbon dioxide, argon and hydrogen sulfide, that diffuse through barrier layer 202. According to conventional wisdom, the reactive nature of reactive layer 204 is undesirable in solar cell and other applications, because it absorbs moisture and undesirable ambient gases, causing product performance degradation and eventually leading to product failure. The present invention, however, innovatively uses the reactive nature of reactive layer 204 in a manner that is useful for barrier stack applications. Specifically, moisture and ambient or undesired gases that diffuse through barrier layer 202 react with reactive layer 204, allowing multilayer stack 200 to be substantially impervious to the diffused gas or vapor molecules.

Reactive layer 204 may be made from any inorganic material and is preferably chemically homogenous. In preferred embodiments of the present invention, however, reactive layer 204 include at least one reactive material selected from a group consisting of alkali metal oxide, zinc oxide, titanium oxide, metal-doped zinc oxide and silicon oxide. In certain embodiments of the present invention, reactive layer 204 is doped with one or more non-oxide chemical components. Representative examples of such non-oxide dopant materials include alkali metals, such as calcium, sodium and lithium.

Each of one or more reactive layers may be made from the same material or from different materials. Like barrier layer 202, reactive layer 204 may include one or more reactive layers that are disposed adjacent to each other. Reactive layer 204 includes an effective amount of a reactive material to react with the moisture and undesired or ambient gases that have diffused through an adjacent barrier layer. In preferred embodiments of the present invention, in reactive layer 204, reactive material has a concentration that is between about 1% (by weight) and about 100% (by weight). In more preferred embodiments of the present invention, however, reactive material in reactive layer 204 has a concentration that is between about 90% (by weight) and about 100% (by weight).

Reactive layer 204 may have a total thickness that is between about 10 nm and about 1 micron and that is preferably between about 20 nm and about 500 nm. In certain applications where multilayer stack 200 is fabricated on a plastic substrate and used as an encapsulant, there is a risk that during shipping, handling and storage of the encapsulated product, moisture and undesired ambient gases diffuse through the plastic substrate and react with reactive layer 204. As a result, the required reactive property of reactive layer 204 is depleted, rendering the multilayer stack 200 ineffective. To this end, certain preferred embodiments of the present invention provide an extra barrier layer which is disposed between the plastic substrate and the reactive layer.

If reactive layer 204 is compositionally similar to barrier layer 202, then it is preferable to have the reactive layer sufficiently different from the barrier layer in structure, degree of doping, degree of crystallinity (including a scenario where one layer is amorphous, while the other is not), or reactivity to bind with moisture or undesired ambient gases.

Figure 3:
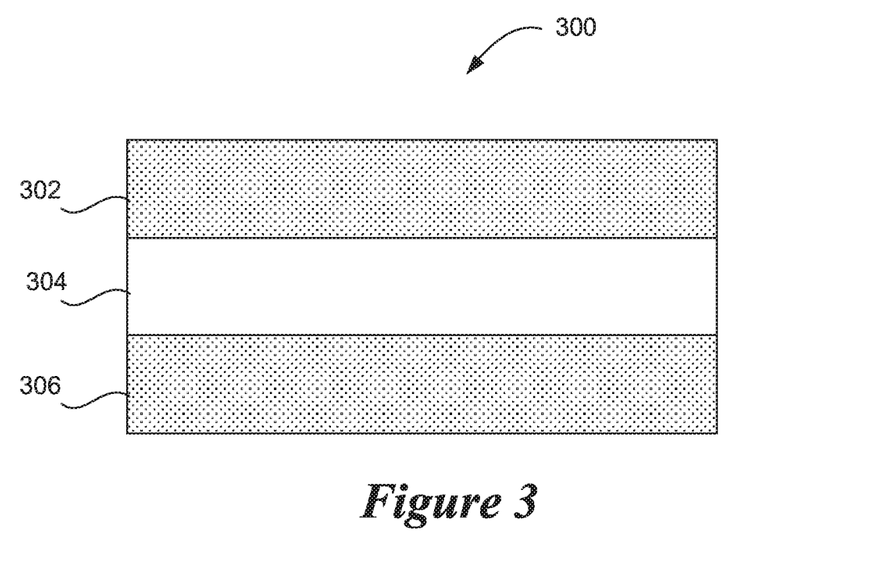
FIG. 3 shows a side-sectional view of a multilayer barrier stack, according to another embodiment of the present invention, for protecting against moisture and other undesirable ambient gases.

FIG. 3 shows a multi-layer stack 300, according to alternate embodiment of the present invention. Multi-layer stack 300 includes a reactive layer 304 that is sandwiched between two barrier layers 302 and 306. Reactive layer 304 of FIG. 3 is substantially similar to reactive layer 204 of FIG. 2, and barrier layers 302 and 306 of FIG. 3 are substantially similar to barrier layer 202 of FIG. 2. Like multilayer stack 200, multilayer stack 300 is also fabricated on any substrate. In preferred embodiments of the present invention, however, stack 300 is fabricated on a flexible, plastic substrate.

In the configuration of the multilayer stack shown in FIG. 3, moisture or molecules of undesired or ambient gas that diffuse through the plastic substrate are blocked by barrier layer 302 before they reach reactive layer 304. Barrier layer 302 consequently protects reactive layer 304 against moisture and undesired or ambient gases that diffuses through the polymeric substrate backing.

Figure 4:
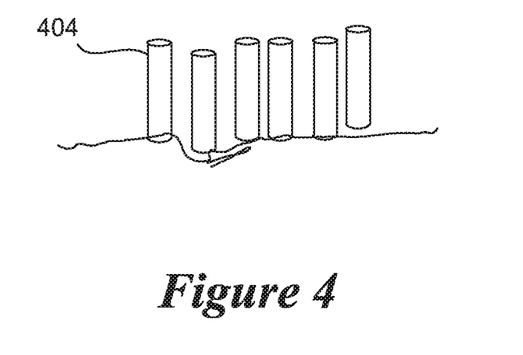
FIG. 4 is a perspective view of a columnar reactive layer structure, according to one embodiment of the present invention that may be used in the multilayer barrier stack of FIGS. 2 and/or 3.

Regardless of whether multilayer stack 200 of FIG. 2 or multilayer stack 300 of FIG. 3 is used, a component reactive layer preferably has a columnar structure 404, shown in FIG. 4, disposed as a reactive layer (e.g., reactive layer 204 of FIG. 2 or reactive layer 304 of FIG. 3). A reactive layer having a columnar structure represents a preferred embodiment of the present invention because such structure provides more active surface area that reacts with the diffused chemical species.

Although inventive barrier and reactive layers of FIGS. 2 and 3 are shown to contact each other, it is not necessary that they do so. In certain embodiments of the present invention, an intermediate layer, serving one or more of variety of functions, may be interposed between the barrier and the reactive layers. By way of example, an intermediate layer may be used to planarize either or both of the surfaces of the barrier and the reactive layers, between which it is interposed. As a result, in those instances where the specification describes that a barrier layer is disposed adjacent to a reactive layer, the term "adjacent" is not limited to embodiments where the barrier and the reactive layers contact each other and also covers those embodiments where one or more intermediate layers are interposed between the barrier and the reactive layers.

Furthermore, according to the above-described preferred embodiments, each of inventive barrier and reactive layers are made from one or more different types of inorganic materials. However, in other embodiments of the present invention, the inventive barrier and reactive layers are not so limited. In certain embodiments of the present invention, each of barrier and reactive layers are made from one or more different types of organic materials.

In preferred embodiments of the present invention, multilayer stack 200 of FIG. 2 and multilayer stack 300 of FIG. 3 are used as an encapsulant. By way of example, in a solar cell application, the inventive multilayer stacks are used to encapsulate a solar cell. As another example, in a lighting application, where a light generating module is used, the inventive multilayer stacks are used to encapsulate a light source. As yet another example, in an electrolytic cell application, the inventive multilayer stacks is used to encapsulate a cathode, an anode and an electrolyte. As yet another example, in display applications, the inventive multilayer stacks are used to encapsulate displays, such as an LED display or a reflective display. Those skilled in the art will recognize that encapsulation of solar cells, light generating modules, electrolytic cells, LED displays and reflective displays is carried out using techniques well known to those skilled in the art.

According to conventional wisdom, when one layer is fabricated adjacent to another layer to form a multilayer stack, a defect present in one layer undesirably propagates to the adjacent layer. The defect propagation problem exacerbates as the number of layers in the multilayer stack increases. In sharp contrast, the present invention has surprisingly and unexpectedly found that an inorganic layer covers defects found in and smoothens the adjacent layer. As a result, inventive multilayer stacks are particularly advantageous for moisture and vapor barrier applications because they prevent or significantly reduce the propagation of defects or undesired structure from one layer to another.

Figure 5:
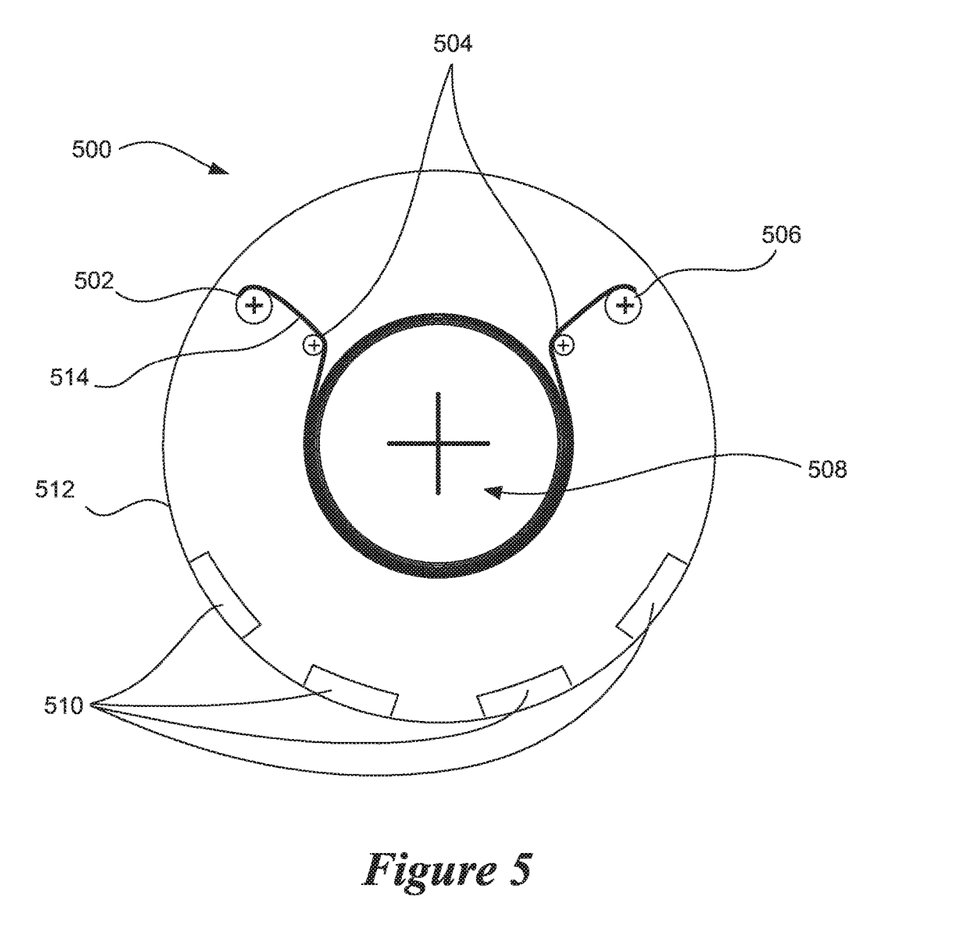
FIG. 5 is a top view of a coating machine, according to one embodiment of the present invention that facilitates roll-to-roll manufacture of the inventive multilayer stacks.

Although inventive multilayer stacks can be made using any technique well known to those skilled in the art, using a roll-to-roll technique, which provides a relatively high throughput, represents a preferred embodiment of the present invention. FIG. 5 shows a top view of a coating machine 500, according to one embodiment of the present invention. The coating machine is also called a "roll coater" as it coats a roll of flexible film. Coating machine 500 includes an unwind roller 502, an idle roller 504, a takeup roller 506, a temperature controlled deposition drum 508, one or more deposition zones 510, and a deposition chamber 512. Each of one or more deposition zones 510 includes a target material that is ultimately deposited on flexible substrate, a power supply and shutters, as explained below.

A coating process, according to one embodiment of the present invention, begins when a flexible substrate 514 is loaded onto unwind roller 502. Flexible substrate 514 is preferably wrapped around a spool that is loaded onto unwind roller 502. Typically a portion of the wrapped flexible substrate is pulled from the spool and guided around idle rollers 504 and deposition drum 508, which is capable of rotating, so that it connects to takeup roller 506. In the operating state of coating machine 500, unwind roller 502, takeup roller 506 and deposition drum 508 rotate, causing flexible substrate 514 to displace along various locations around cooled deposition drum 508.

Once flexible substrate 514 is loaded inside coating machine 500, the coating process includes striking a plasma inside deposition zone 510. Shutters in the coating zones direct charged particles in the plasma field to collide with and eject the target material so that it is deposited on the flexible substrate. During the coating process, a temperature of flexible substrate 514 is controlled using deposition drum 508 preferably to values such that no damage is done to the substrate. In those embodiments of the present invention where flexible substrate 514 includes a polymeric material, deposition drum 508 is cooled such that the temperature of the deposition drum is preferably near or below a glass transition temperature of the polymeric material. Such cooling action prevents melting of the polymer-based substrate during the deposition process, and thereby avoids degradation of the polymer-based substrate that might occur in the absence of deposition drum 508.

As can be seen from FIG. 5, multiple deposition zones are provided, each of which may be dedicated to effecting deposition of one particular material on the polymeric substrate. By way of example, the target material, in one of the deposition zones, includes at least one member selected from a group consisting of a metal, a metal oxide, a metal nitride, a metal oxy-nitride, a metal carbo-nitride, and a metal oxy-carbide to facilitate deposition of a barrier layer (e.g., to fabricate barrier layer 202 of FIG. 2 or fabricate at least one of barrier layers 302 and 306 of FIG. 3). As another example, the target material in another of the deposition zones includes at least one member selected from a group consisting of alkali metal oxide, zinc oxide, titanium oxide, metal-doped zinc oxide and silicon oxide to fabricate a reactive layer (e.g., to fabricate reactive layer 204 of FIG. 2 or reactive layer 304 of FIG. 3). By displacing flexible substrate 514 from one location to another, different types and different thicknesses of target material, at different deposition zones, can be deposited on the substrate. Coating machine 500 can be used to implement at least one technique selected from a group consisting of sputtering, reactive ion sputtering, evaporation, reactive evaporation, chemical vapor deposition and plasma enhanced chemical vapor deposition.

It is noteworthy that instead of displacing the substrate from one position to another to facilitate deposition of multiple layers, the inventive features of the present invention can be realized by holding the substrate stationary and displacing at least a portion of the coating machine or by displacing both the substrate and the coating machine.

Regardless of the specific process implemented for deposition, it will be appreciated that the roll-to-roll technique of the present invention allows for very rapid deposition of different types and thicknesses of layers on a substrate to form the inventive multilayer stacks. The inventive roll-to-roll fabrication process realizes a very high throughput, which translates into increased revenue. Against the current backdrop where the solar cell industry is being challenged to become a commercially viable alternate energy solution, the inventive multilayer stacks and processes represent a marked improvement over the conventional designs and processes.

As explained above, barrier and reactive layers in multilayer stack 300 of FIG. 3 may be made from appropriate inorganic oxide materials such that the resulting multilayer stacks are both flexible and impervious to water vapor. The present invention recognizes that if the amount of water vapor adsorption through the barrier layer is limited, then the reactive layer inside the multilayer stack enjoys an extended life span. Moreover, the present invention also recognizes that limited adsorption is achieved by minimizing the amount of water vapor arriving at the interface of the barrier and the reactive layers.

Although illustrative embodiments of this invention have been shown and described, other modifications, changes, and substitutions are intended. By way of example, the present invention discloses barriers of simple gases and water vapor; however, it is also possible to reduce the transport of organic material using the systems, processes, and compositions of the present invention. Accordingly, it is appropriate that the appended claims be construed broadly and in a manner consistent with the scope of the disclosure, as set forth in the following claims.

What is claimed is:

1. A multilayer stack, comprising:
   one or more inorganic barrier layers for reducing transport of gas or vapor molecules therethrough;
   an inorganic reactive layer disposed adjacent to said one or more inorganic barrier layers, said inorganic reactive layer capable of reacting with gas or vapor molecules, said inorganic reactive layer is doped with one or more non-oxide chemical components; and
   wherein said one or more inorganic barrier layer is completely coextensive with said inorganic reactive layer such that each portion of said reactive layer has disposed thereon said one or more inorganic barrier layer, and in an operational state of said multilayer stack, vapor or gas molecules that diffuse through said one or more inorganic barrier layers react with said inorganic reactive layer, and thereby allow said multilayer stack to be substantially impervious to gas or vapor molecules.

2. The multilayer stack of claim 1, wherein vapor or gas molecules includes at least one member selected from a group consisting of moisture, oxygen, nitrogen, hydrogen, carbon dioxide, argon and hydrogen sulfide.

3. The multilayer stack of claim 1, wherein said inorganic barrier layer includes at least one member selected from a group consisting of a metal, a metal oxide, a metal nitride, a metal oxy-nitride, a metal carbo-nitride, and a metal oxy-carbide.

4. The multilayer stack of claim 1, wherein said inorganic barrier layer includes at least one member selected from a group consisting of aluminum, silver, silicon, zinc, tin, titanium, tantalum, niobium, ruthenium, gallium, platinum, vanadium and indium.

5. The multilayer stack of claim 1, wherein said inorganic reactive layer includes at least one member selected from a group consisting of alkali metal oxide, zinc oxide, titanium oxide, metal-doped zinc oxide and silicon oxide.

6. The multilayer stack of claim 5, wherein said inorganic reactive layer includes an inorganic matrix.

7. The multilayer stack of claim 1, wherein the thickness of said inorganic barrier layer is between about 10 nm and about 1 micron.

8. The multilayer stack of claim 1, wherein the thickness of said inorganic reactive layer is between about 10 nm and about 1 micron.

9. The multilayer stack of claim 1, wherein said one or more barrier layers includes two barrier layers, and said reactive layer is sandwiched between said two barrier layers.

10. The multilayer stack of claim 1, wherein said reactive layer includes columnar structures.

11. The multilayer stack of claim 1, wherein each of said one or more barrier layers are made from one or more amorphous materials.

12. The multilayer stack of claim 1, wherein said inorganic barrier layer is substantially transparent.

13. A composition of a multilayer barrier stack, comprising:
- an inorganic barrier layer for reducing transport of gas or vapor molecules therethrough, and said inorganic barrier layer including at least one member selected from a group consisting of a metal, a metal oxide, a metal nitride, a metal oxy-nitride, a metal carbo-nitride, and a metal oxy-carbide-nitride;
- an inorganic reactive layer including an effective amount of a reactive material to react with gases or vapor molecules that have diffused through said inorganic barrier layer, and said reactive material includes at least one material selected from a group consisting of alkali metal oxide, zinc oxide, titanium oxide, metal-doped zinc oxide and silicon oxide; and
- wherein said inorganic reactive layer is doped with one or more non-oxide chemical components, and wherein said inorganic barrier layer is completely coextensive with said inorganic reactive layer such that each portion of said reactive layer has disposed thereon said inorganic barrier layer.

14. The composition of claim 13, wherein said at least one member in said inorganic barrier layer has a concentration that is between about 1% (by weight) and about 100% (by weight).

15. The composition of claim 13, wherein said at least one reactive material has a concentration that is between about 1% (by weight) and about 100% (by weight).

* * * * *